United States Patent [19]

Zapach et al.

[11] Patent Number: 5,842,514
[45] Date of Patent: Dec. 1, 1998

[54] ELECTRONIC UNIT

[75] Inventors: Trevor Zapach, Ottawa; William D. Jeakins, Kanata; Steven Muegge, Nepean, all of Canada

[73] Assignee: Northern Telecom Limited, Montreal, Canada

[21] Appl. No.: 812,831

[22] Filed: Mar. 6, 1997

[51] Int. Cl.⁶ ................................................. F28D 15/00
[52] U.S. Cl. ........................... 165/104.33; 165/134.1; 165/135; 361/724; 361/714
[58] Field of Search ................ 165/104.14, 104.33, 165/104.32, 104.21, 134.1, 135; 361/724, 714; 62/410, 412, 415, 418

[56] References Cited

U.S. PATENT DOCUMENTS

| | | | |
|---|---|---|---|
| 3,626,251 | 12/1971 | Vigue | 361/724 X |
| 4,285,027 | 8/1981 | Mori et al. | 165/104.21 X |
| 4,359,084 | 11/1982 | Geverath et al. | 165/135 X |
| 4,644,443 | 2/1987 | Swensen et al. | 361/724 X |
| 4,866,570 | 9/1989 | Porter | 165/104.21 X |
| 4,921,039 | 5/1990 | Ghiraldi | 165/104.33 X |
| 5,040,095 | 8/1991 | Beaty et al. | 361/724 X |
| 5,057,968 | 10/1991 | Morrison | 165/104.33 X |
| 5,339,214 | 8/1994 | Nelson | 165/104.33 X |
| 5,343,940 | 9/1994 | Jean | 165/104.33 |
| 5,353,192 | 10/1994 | Nordin | 165/104.33 X |
| 5,365,749 | 11/1994 | Porter | 165/104.33 X |
| 5,472,043 | 12/1995 | Larson et al. | 165/104.33 X |
| 5,646,822 | 7/1997 | Bhatia et al. | 165/104.33 X |
| 5,651,414 | 7/1997 | Suzuki et al. | 165/104.33 X |

FOREIGN PATENT DOCUMENTS

| | | | |
|---|---|---|---|
| 0229188 | 12/1984 | Japan | 165/104.34 |
| 001418938 | 8/1988 | U.S.S.R. | 361/724 |

*Primary Examiner*—Carl D. Price
*Assistant Examiner*—Christopher Atkinson
*Attorney, Agent, or Firm*—R. J. Austin; Angela C. de Wilton

[57] ABSTRACT

Electronic unit in which a heat conductive mounting comprises two spaced apart holding elements providing a receiving station for a printed circuit board. Edge regions of the board are in heat conductive engagement with the holding elements. Heat is conducted from electronic components on the board into the holding elements and from there into heat pipes connected to the holding elements. A housing around the heat pipes has apertures for flow of cooling air around the heat pipes. Part of the housing around the receiving station is thermally insulated thereby ensuring that substantially all of the heat is removed through the heat pipes.

13 Claims, 4 Drawing Sheets

ELECTRONIC UNIT

This invention relates to electronic units.

Of recent times there has been a growing interest in the use of electronic apparatus and equipment in outside plant environments particularly for wireless telecommunications usage including broadband applications. Such applications may include the use of substrates carrying electronic components. Such components may vary in their physical size and cooling requirements the latter of which on a substrate is also affected by the density and arrangement of the components. To prevent breakdown of individual components and thus of total apparatus or equipment, heat needs to be removed to prevent excessive heat build-up which may result in such a breakdown. Failure does of course lead to expenditure on maintenance and repair procedures as well as in the cost of replacement parts or in the complete electronic circuitry members. Electronic equipment is sometimes provided with electrically operated fans to remove unwanted heat. Outside temperatures may average between −20° C. and 35° C. with average daily fluctuations of 15° C. Temperature extremes from −50° C. to +50° C. may occur and the problem is exacerbated in that low temperature conditions occur at night when power dissipation from the equipment is at its minimum and radiation to the night sky is providing maximum cooling. Conversely, high temperature peaks occur when the equipment is at its maximum power dissipation and solar loading is at its maximum. Electrically controlled heating means are provided particularly for use in outside environments which are subject to such large differences in temperature, such heating means being operable in concert with the cooling fans to maintain the electronic components within normal operating temperature ranges. In these cases, it is not unusual to incorporate shut-off dampers operating in conjunction with fan operation either to allow flow of cooling air or to prevent cooling air circulation when the heating means is switched on.

As may be seen from the above, continued operation of electronic components incorporated in electronic equipment is dependent upon temperature control being maintained. Thus, if there is a breakdown in temperature control devices then failure in one or more electronic components may be prevented only if the breakdown is corrected sufficiently quickly. Electronic equipment using both cooling and heating devices is most vulnerable to breakdown. In particular, in electronic equipment used in outside environments incorporating both cooling and heating devices, it is not practical in most outside situations for personnel to be expected to maintain regular inspections of the equipment to ascertain its correct operation. Also, outside repair may be extremely time consuming because of location and weather conditions as compared to a similar inside repair operation. There is therefore a high potential risk that breakdown in relatively inexpensive heating and/or cooling devices will result in failure of electronic components which could be extremely expensive to replace, for instance, if the whole of a printed circuit board carrying the component needs to be replaced.

In order to overcome the above problems and avoid the necessity of using electrically operated cooling and heating equipment, passive thermal and humidity solutions have been proposed. For instance, in U.S. Pat. No. 5,548,643 a wireless base station is provided for outdoor use and having a passive heat control comprising a heat conductive upwardly extending vertical rear wall and an upwardly extending air flow passage interconnected for air circulation at upper and lower positions to an upwardly extending rearward air flow passage defined partly by the rear wall. At least one circuit pack extends upwards within the housing of the base station with electronic components extending into the forward air passage. In operation heat generated flows through the air passages to be collected by the rear wall to be dispersed outwardly from the base station. Such equipment as described in this patent is suitable for heat control for low power electronics and because of the design arrangement it is extremely difficult or impossible to provide means for the passive thermal and humidity management to operate effectively over a wide range of electrical power requirements. Such limitations of use also apply to an electronic unit as described in U.S. Pat. No. 5,552,961 which employs a phase change material to control the position of a printed circuit board relative to a heat sink so as to change the rate of heat removal from the board as required to control the temperature of the board and thus of its components.

The present invention seeks to provide an electronic unit having a passive thermal management and which may be designed to operate within a wider electrical power range.

Accordingly, the present invention provides an electronic unit comprising a heat conductive mounting comprising two spaced-apart holding elements defining a receiving station region for at least one substrate carrying an electronic component with remote edge regions of the substrate held in heat conductive engagement with the holding elements, heat pipe means heat conductively connected to the holding elements for removal of heat from the conductive mounting, and housing means around the receiving station region, the conductive mounting and the heat pipe means, the housing means formed with apertures to permit cooling air to flow by convection across surfaces of the heat pipe means.

In the above defined invention, the heat pipe means while being connected to the conductive mounting is not restricted by the size of the mounting, by the size of the receiving station region or by the number of substrates to be carried by that region. Thus, the size and design of the heat pipe means and hence its heat removal capacity may be as required and may be such as to be capable of removing required amounts of heat from the receiving station region up to at least 700 watts of heat dissipation.

Preferably the housing means comprises a housing part which extends over the receiving station region and which is thermally insulated to restrict heat conductivity through the cover from the receiving station region. With this arrangement, the rate of heat removal is controlled substantially completely by the heat pipe means alone. Hence, for hot conditions within the receiving station region, the heat pipe means is effective in removing heat as required to prevent over heating of the electronic component on the substrate. Alternatively, when the ambient temperatures are low, then to maintain a preferred operating temperature range of the electronic component, the thermally insulated part of the housing severely restricts conduction of heat from the receiving station region. With the temperature sufficiently low, the fluid within the heat pipe means is caused to freeze thereby preventing fluid motion and the conduction of heat through the heat pipe means from the receiving station region. In such low temperature circumstances therefore the receiving station region is substantially completely thermally insulated from the ambient environment whereby a heat threshold is maintained within that region.

In the case where thermal insulation is provided for the housing part surrounding the receiving station region, then it is preferable for a humidity control device to be provided in the housing to enable a moisture balance to be created between the inside and the outside of the thermally insulated part of the housing. With the receiving station region operating at a higher than ambient temperature during low temperature conditions, this also prevents the build-up of condensate upon the substrate or electronic component which could cause deterioration and breakdown of the system.

Embodiments of the invention will now be described, by way of example, with reference to the accompanying drawings, in which.

Figure 1:
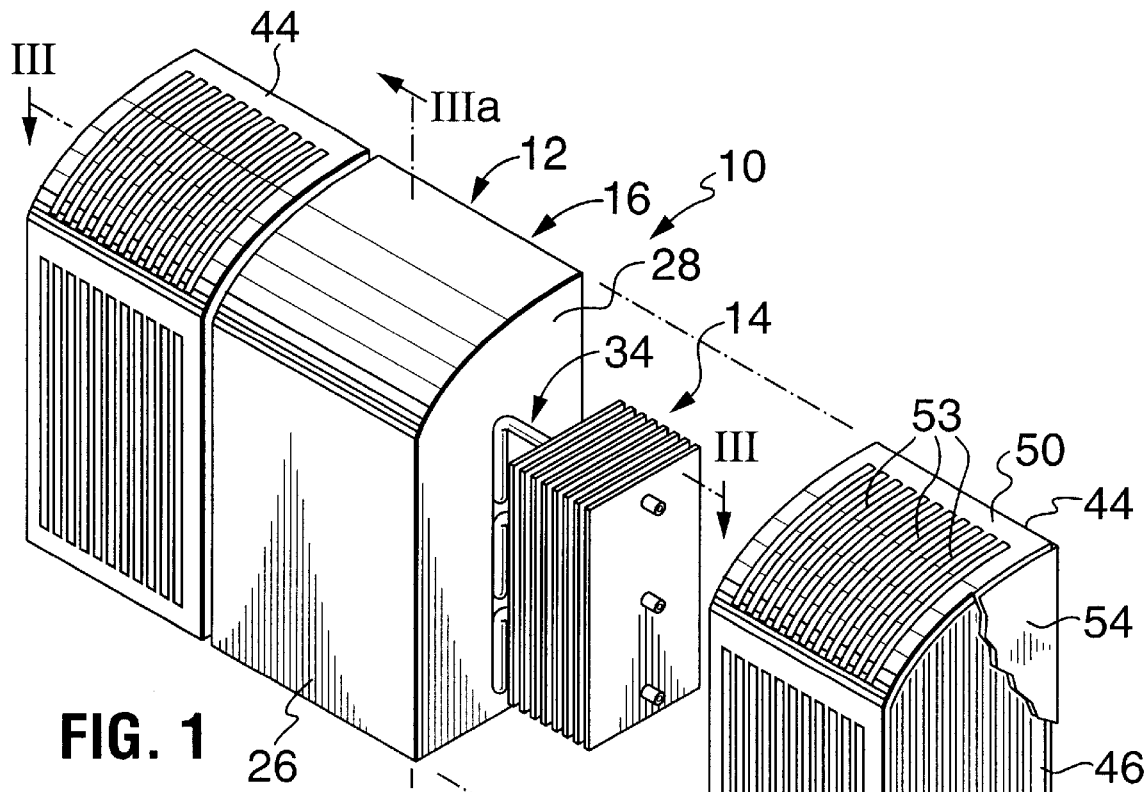
FIG. 1 is a partially exploded isometric view of an electronic unit according to a first embodiment, the unit also shown partly in section.
Figure 2:
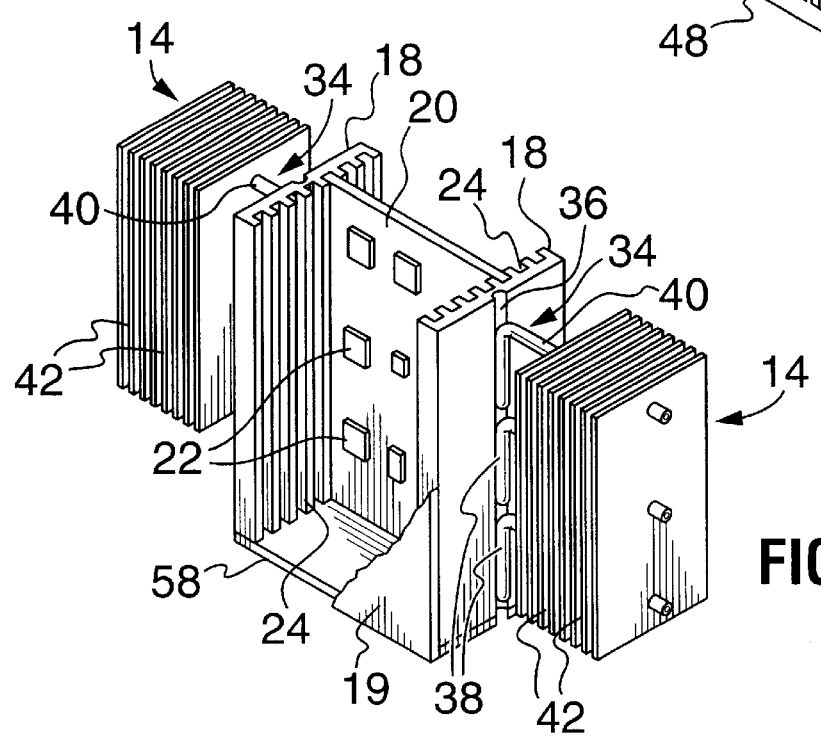
FIG. 2 is a view similar to FIG. 1 showing the unit of the first embodiment with a housing means removed.
Figure 3:
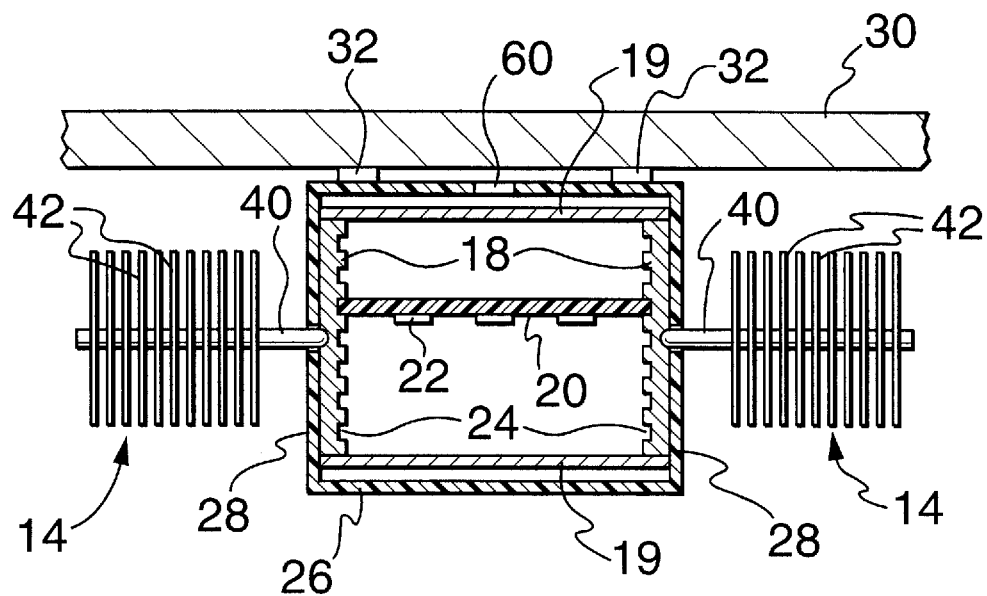
FIG. 3 is a cross-sectional view through the unit of the first embodiment taken along line III—III in FIG. 1.

In a first embodiment as shown in FIGS. 1, 2 and 3, an electronic unit 10 for outside plant usage generally comprises a receiving station region 12, heat pipe means 14 for extracting heat in controlled manner from the receiving station 12 and a housing means 16 which surrounds the receiving station region and the heat pipe means. The heat pipe means comprises two heat pipe structures 14 disposed one at each side of the receiving station region 12.

Figure 3A:
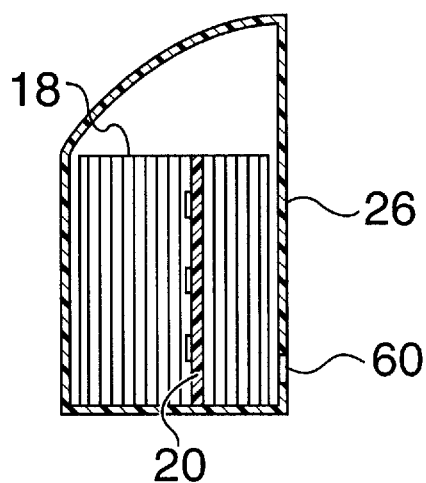
FIG. 3a is a cross-sectional view of the unit of the first embodiment taken along line IIIa—IIIa in FIG. 1.

The receiving station region comprises two spaced apart vertically extending holding elements 18 providing between them a plurality of vertical side-by-side receiving stations for substrates in the form of printed circuit boards 20 each carrying a plurality of electronic components 22 as part of the circuitry of the board. The holding elements 18 are held in relative positions by frame members 19. For reception purposes of the boards 20 in the receiving stations, the holding elements 18 are provided with vertically extending guide slots 24 which are aligned from one holding element to the other for the vertical sliding reception of the boards 20. The boards 20 when disposed in their receiving stations lie in frictional engagement with the sides of the guide slots 24 whereby the boards are in heat conductive engagement with the holding elements 18. The whole of the receiving station region 12 including the holding elements 18 is contained within a central part 26 (FIGS. 1 and 3a) of the housing means and with the central part 26 of the housing means having portions 28 extending around remote end faces of the holding elements 18 as shown by FIG. 3. The holding elements 18 are formed from a heat conductive material such as aluminum.

Each of the heat pipe structures 14 is heat conductively connected to an individual holding element 18 as shown particularly by FIGS. 2 and 3. Conveniently, for mounting reasons upon a vertical wall such as wall 30 shown in FIG. 3, the two heat pipe structures 14 extend from opposite sides of the receiving station region as stated above so as to be in lateral alignment with the receiving station region. The unit is conveniently provided with wall mounting brackets 32 which may, for instance, as shown by FIG. 3, be connected to the housing part 26 if this is sufficiently strong for the purpose. Alternatively the brackets 32 extend through the housing part 26 to be connected to a frame member 19.

It is necessary for each heat pipe structure to have at least one heat pipe and in the case of the embodiment, there are three heat pipes 34 which are heat conductively connected to the associated holding element 18. The outer vertical surface of each holding element 18 is provided with a semi-circular vertical groove 36 for heat conductive contact to the three heat pipes 34 of the associated structure 14. As shown by FIG. 2, each heat pipe 34 comprises an upwardly extending portion 38 which is secured within the groove 36 in heat conductive engagement around substantially half the circumference of the tube portion 38 with the holding element 18. The three portions 38 of the tubes are disposed vertically apart in series with each heat pipe 34 having a horizontal portion 40 extending from the upper end of the vertical portion 38. Thus the horizontal portions 40 lie vertically one above the other and extend outwardly from the holding element 18 and away from the receiving station region. Each heat pipe structure also includes a plurality of heat emitting fins 42 which are carried by the portions 40 of the heat pipes 34. While it is possible for each horizontal portion 40 to carry its own individual small fins, with the construction of the embodiment and to provide a large heat emitting surface area, each of the fins 42 extends vertically for at least the vertical distance of each of the holding elements 18 and is secured heat conductively to each of the horizontal portions 40 of the pipes 34. Thus, in each structure 14, each of the pipes 34 is heat conductively connected to all of the fins 42 and holds the fins horizontally spaced-apart to allow for convection of cooling air to pass upwardly between the fins. Each of the fins 42 is thus of its largest size compatible with exposing the greatest surface area for heat exchange purposes.

Figure 3B:
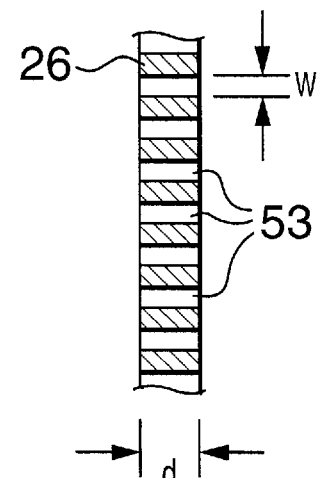
FIG. 3b is a cross-sectional view of part of the unit of the first embodiment taken along line IIIb—IIIb in FIG. 1 and to a larger scale.

The housing means 16 also comprises two housing parts 44 disposed one at each side of the part 26, i.e. so as to cover the heat pipe structures 14. As indicated by FIG. 1, each of the housing parts 44, which is mounted upon the housing part 26, is horizontally removable by sliding movement from the associated heat pipe structure 14 and away from the receiving station region 12. Each of the housing parts 44 is non-thermally insulated. As will be realized, it is necessary for convected air to pass between the fins 42 for removal of heat from the heat pipe means. For this purpose, a back 46, front 48, top 50 and base 52 of each of the housing parts 44 are provided with air flow apertures 53 as will now be described. An end face 54 of each of the housing parts 44 is not provided with air flow apertures but may have such apertures if required. It is an important aspect of the embodiment that each of the air flow apertures has a depth 'd' which exceeds the width 'w' of the apertures shown by FIG. 3b. This is provided for the purpose of ensuring that little or no sunlight actually impinges upon each heat pipe structure 14 and which could negatively affect the release of heat therefrom. While the apertures may be of any configuration which provide the required depth to width ratio, i.e. the apertures may be circular, in this embodiment the apertures are formed as slots as shown by FIG. 1. The apertures lie in rows with the apertures in each row slightly spaced apart and parallel and with the apertures being spaced end-to-end from one row to another. In the front, rear and top walls the apertures extend upwardly and in the base 52 they extend from front to rear of the housing part 44.

In use of the electronic unit of the first embodiment, a top of the housing part 26 is removable (not shown) for insertion and removal of the printed circuit boards 20 as required.

Upon insertion, each of the boards 20 makes connection with a common interconnection board 58 extending horizontally along the base of the receiving station region. During operation, heat generated by the electronic components upon each of the printed circuit boards 20 is transferred along the boards and into the holding elements 18. For assisting in heat conduction, it is preferable for each of the printed circuit boards to have a heat spreader plane, preferably of copper, extending throughout the area of the board to transfer heat to its outer edges. The heat reaching the housing elements 18 is then transferred into each of the heat pipe structures 14 through the vertical pipe portions 38 and from thence into heat pipe portions 40 and into the fins 42. Convected air passing through the housing parts 44 is convected between the fins 42 for removal of the heat. Because of the positioning of the apertures 53 in each of the walls (except possibly the end wall) of the housing parts 44, then convected air may pass upwardly through the apertures in the base 52 and through apertures in either the front and rear walls, through the top wall 50 or through each of these walls dependent upon the methods of mounting of the unit upon a mounting wall. The convection of air may also be affected by wind force and wind direction which may in fact cause cooling air to flow with a horizontal component between the front and rear walls of the housing parts 44.

Thus, in use, with the housing part 26 thermally insulated, insignificant quantities of heat are conducted through this housing part. Hence the only significant heat which is transferred from the receiving station region is conducted through the holding elements 18 and thence into the vertical portions 38 of the tubes 34 to be withdrawn from the structure by convected air passing between the fins 42 and the tubes 34. The design of the unit is such that neither the size nor design of each heat pipe structure 14 is dependent upon the size of the receiving station region. Hence, each heat pipe structure may extend to any desired length away from the associated holding element 18 and be provided with the required number of fins 42 for maintaining the temperature within the receiving station region 12 below that which could be detrimental to the electronic components on the boards. The design therefore as basically shown in the first embodiment is adaptable for use in ambient temperatures between −50° C. and +50° C. while maintaining the required temperature conditions within the receiving station region. With the use of the thermally insulated cover portion 26 and when operating at extremely low temperatures, the fluid contained within the heat pipes 34 and which normally convects heat to the fins 42 is caused to freeze. This freezing action severely limits the amount of heat which can then be transferred by the heat pipe structures to the fins and, as the receiving station region is thermally insulated, then the temperature within that region is maintained at a satisfactory high level for use purposes.

It is convenient for manufacturing purposes for the housing to be molded from a plastics material which may be for instance be a glass filled polycarbonate structure of good flexibility with high impact resistance and extreme rigidity. Certain plastics including this particular material have certain permeability factors which enable build-up of moisture in the air contained within the housing part 26. Steps must therefore be taken to remove the moisture from this enclosed air and also to provide a moisture balance between the inside and the outside of the housing part so as to minimize or cancel any tendency for condensation accumulation upon the electronic parts within the housing and which may be deleteriously affected thereby. For this purpose, a humidity control device 60 is disposed at the lower end of the rear wall of the housing portion 26 (FIG. 3a), this device including a wall of expanded teflon having a grid size of up to 3 microns for the purpose of equalizing humidity on the two sides of the teflon wall. Expanded teflon available under the trade name GORTEX has been found to be completely suitable. It is worthy of note that with the equalization of humidity between the inside and the outside of the housing part 26, during low ambient operating temperature conditions, the temperatures within the receiving station region 12 are maintained higher than the ambient temperatures thereby eliminating any possibility of formation of condensate upon the printed circuit board surfaces or upon the electronic components.

In summary, therefore, the structure of the first embodiment and within the scope of the invention is one which is capable of providing for control of heat to enable operation of an electronic unit having electronic components between wide ranges of temperatures, e.g. between −50° C. and +50° C. The structures of the invention are also capable of being made light in weight which has strong commercial advantages in manufacture and mounting. The heat pipe structures are not limited in design or size by the size or configuration of the receiving station region of the unit. Also, with the structure of the embodiment, the housing operates to act as a solar and environmental shield with the housing parts 26 also providing required thermal insulation. The solar shield is provided even though air is permitted to pass through the housing by the design of the air flow apertures with their required depth to width ratios.

Figure 4:
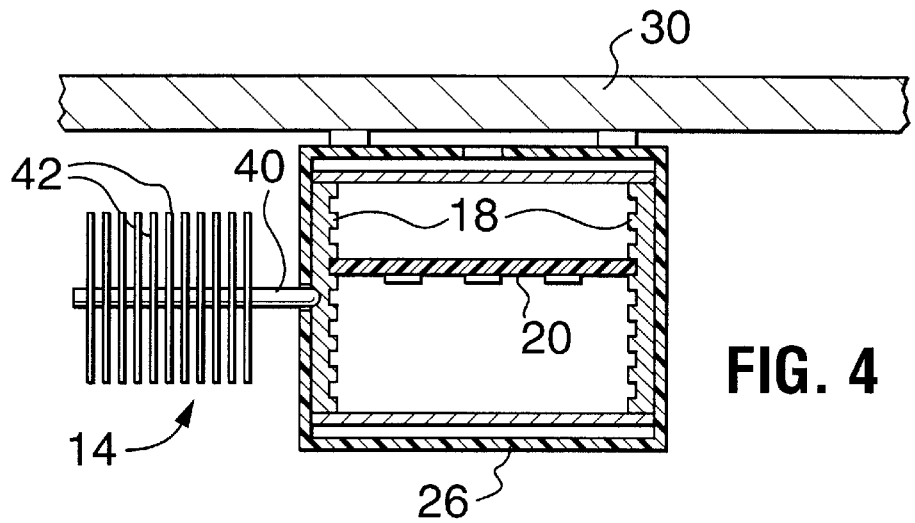
FIG. 4 is a view similar to FIG. 3 of a modification of the first embodiment.

For certain requirements, it may not be necessary to have a heat pipe structure at each side of the receiving station region. For instance, as shown in FIG. 4, which is a modification of the first embodiment, only one heat pipe structure 14 is included and this lies to one side of the receiving station region 12. Apart from this difference, the structure of the modification is exactly the same as described with regard to the first embodiment.

It is not necessary in structures according to the invention to have the heat pipe structures of the configuration described in the first embodiment nor is it necessary to have the heat pipe structures connected to the holding elements in the manner already described. For instance, as shown in a second embodiment in FIG. 5, which is a plan view of an electronic unit, two holding elements 18a for holding printed circuit boards 20 in a receiving station region 12 are disposed in vertical and parallel spaced-apart positions one at the front and one at the rear of the unit. The holding elements 18a are held in these positions by frame members 19a extending from front to rear of the unit. As with the first embodiment, the receiving station region and the holding elements 18 are enclosed by a part 26 of a housing means 16.

In the second embodiment two heat pipe means 70 are provided, one heat pipe means being heat conductively connected to the rear holding element 18 and the other to the front holding element. Each heat pipe means 70 comprises a plurality of heat pipes (one only being shown in each case) which are vertically spaced-apart and are thus superimposed in plan view. Each pipe 72 comprises a portion 74 which lies in heat conductive connection with a remote vertical surface of its associated holding element 18 in a manner similar to the connection between the pipe portions 38 and the holding elements 18 in the first embodiment. In the second embodiment however the pipe portions 74 extend horizontally, in opposite directions, from one heat pipe means to the other. These portions 74 connect by bend portions 76 with outwardly extending portions 78 which are commonly connected to spaced-apart vertical fins 42 in a manner similar to the structure in the first embodiment. Hence, in the second embodiment as in the first embodiment, the fins 42 of the heat pipe means and the receiving station region are in alignment with the receiving station region between the two sets of fins. The operation of the second embodiment is basically similar to that of the first embodiment and has the advantages as discussed above.

Figure 5:
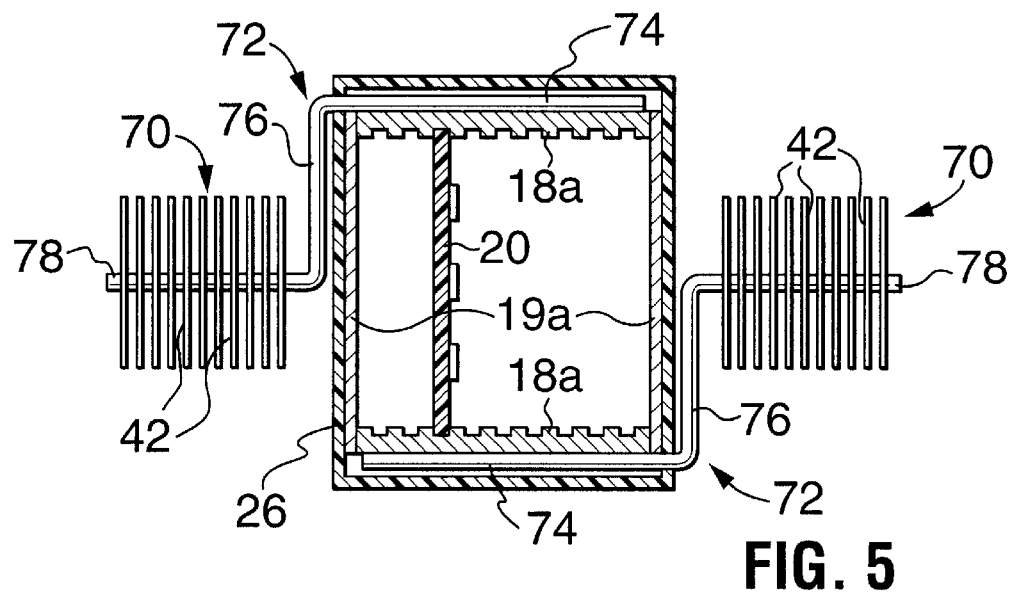
FIG. 5 is a view similar to FIG. 3 of a second embodiment.

In the second embodiment discussed above, the printed circuit boards 20 are of course inserted vertically into their receiving stations as in the first embodiment. However, in a modification of the second embodiment (not shown) the structure in the modification is exactly as shown in FIG. 5 but is, instead, in side elevation so that the holding elements 18a are horizontally disposed one above another instead of vertically disposed one behind the other as in the second embodiment. In the modification of the second embodiment, therefore the front of the housing part 26 has a removable cover (not shown) to enable the printed circuit boards 20 to be inserted horizontally from the front of the unit into the receiving stations of the receiving station region.

In a further modification of the second embodiment also not shown, the frame members 19a are heat conductively connected to ends of the holding elements 18 and each of the heat pipe means also comprises further heat pipes which are heat conductively connected to the frame members 19a to extend also between the fins 42. These further heat pipes are connected to the frame members 19a in a similar manner to the connection of the heat pipes 34 to the holding elements 18 of the first embodiment.

Figure 6:
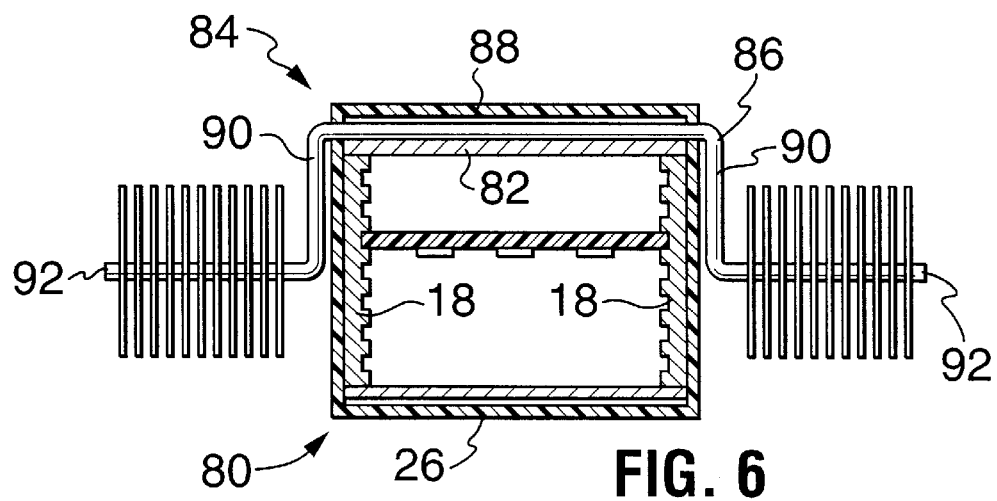
FIG. 6 is a view similar to FIG. 3 of an electronic unit according to a third embodiment.

In a third embodiment, as shown by FIG. 6, which is also a plan view, the two holding elements 18 are spaced apart horizontally across an electronic unit 80 as described in the first embodiment and so as to extend from the front towards the rear of the unit. In this particular case however the holding elements 18 form part of a U-shape structure having a base structural member 82 which extends along a rear section of the receiving station region. This base member 82 is also enclosed by the housing part. In the third embodiment, a single heat pipe structure 84 is provided and which extends beyond each end of the receiving station region. This single heat pipe structure comprises a plurality of horizontally extending heat pipes 86 which are superimposed one upon another as shown by FIG. 6. Each of the heat pipes 86 has a portion 88 extending in heat conductive contact with a rear surface of the base member 82. The contact between each portion 88 and the base member 82 is by reception of the heat pipe portion 88 within a semi-cylindrical horizontally extending groove (not shown) in the base member 82 in a similar manner to the reception of the pipe portions 38 in the vertically extending grooves 36 in the first embodiment. Each end of each pipe portion 88 extends by a bend portion 90 into an outwardly extending horizontal pipe portion 92 which is outwardly extending from the associated side of the receiving station region. The pipe portions 92 at each side of the structure are disposed vertically one above another and support common vertically extending fins 42 as described in the first embodiment.

Figure 7:
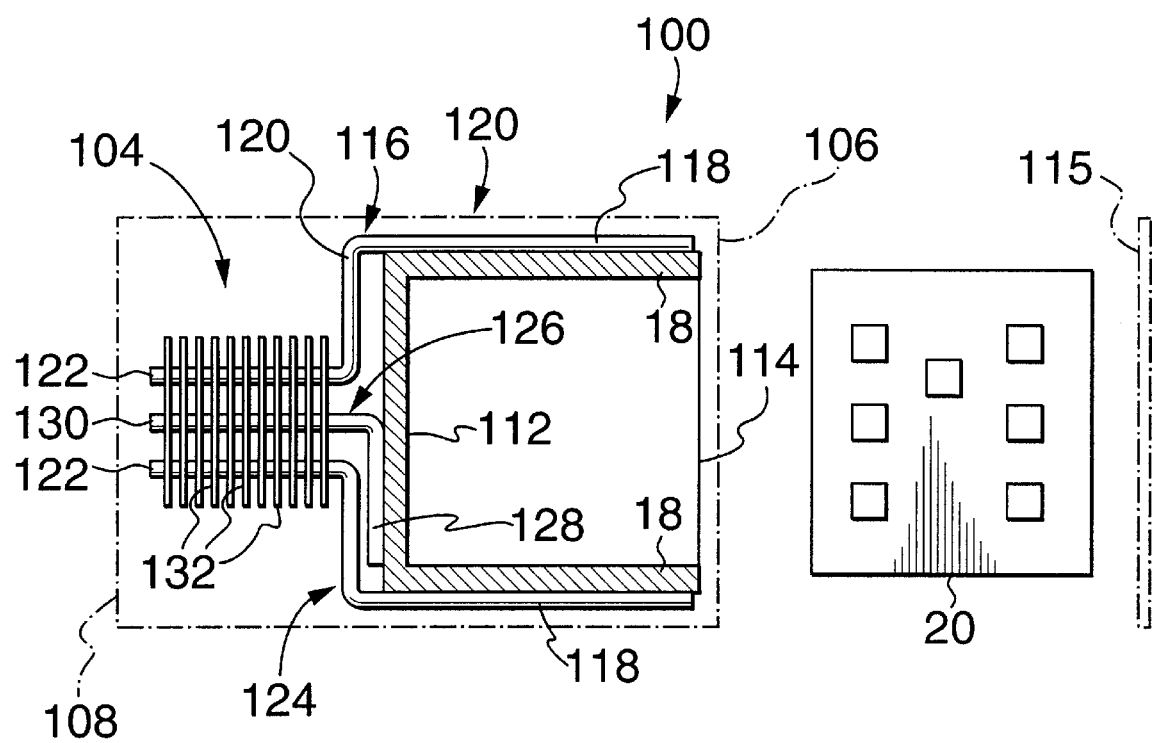
FIG. 7 is a vertical cross-sectional view of an electronic unit according to a fourth embodiment.

In a fourth embodiment as shown by FIG. 7, an electronic unit 100 has a receiving station region 102 with a single heat pipe means 104 disposed to one side only of the region 102. The region 102 is covered by an insulating housing part 106 and the heat pipe means is covered by a housing part 108 similar to the housing parts 44 of the first embodiment.

In the fourth embodiment, within the receiving station region two holding elements 18 are provided, these holding elements being horizontally disposed and spaced apart vertically from one another. The holding elements are connected together at front and rear by a frame member 110 and at the left-hand side as viewed in FIG. 7 by a heat conductive wall 112 heat conductively connected to the elements 18. Thus the structure is a box with an open right-hand side 114 for sideways horizontal insertion and removal of printed circuit boards 20 as indicated by FIG. 7. The housing part 106 has a removable right-hand side insulated cover 115 to cover the open side.

In the structure of the fourth embodiment, a heat pipe means is provided which has three different types of heat pipe. A first set of heat pipes comprises a plurality of horizontally and front to rear spaced apart heat pipes 116 which have portions 118 in heat conductive engagement with the upper holding element 18. These pipe portions 118 are connected by bend portions 120 with outwardly extending pipe portions 122. The second set of pipes 124 are of similar construction to the pipes 116 and are positioned with heat pipe portions 118 beneath and heat conductively connected to the lower holding element 18 with outwardly extending pipe portions 122 disposed beneath the pipe portions 122 of the heat pipes 116. In addition to this, in a third set of pipes 126 which are also horizontally spaced apart in front to rear of the unit, vertical portions 128 of the pipes are heat conductively connected to an outward vertically extending surface of the wall 112 in a similar fashion to the contact between the pipe portions 38 and the holding elements 18 of the first embodiment. In the fourth embodiment these pipe portions 128 are connected to horizontally extending portions 130 which are located between the pipe portions 122 of the first and second set of pipes. All of the portions 122 and 130 commonly support a plurality of vertically extending and horizontally spaced apart fins 132.

With the structure of the fourth embodiment, and as indicated, the printed circuit boards 20 are inserted from the side of the unit and this requires a part of the cover portion 106.

In modifications of the fourth embodiment, one or two of the sets of heat pipes described in the fourth embodiment may be omitted if desired.

What is claimed is:

1. An electronic unit comprising a heat conductive mounting comprising two spaced apart holding elements defining a receiving station region for at least one substrate carrying an electronic component with remote edge regions of the substrate held in heat conductive engagement with the holding elements, heat pipe means heat conductively connected to the holding elements for conductive removal of heat from the conductive mounting, and housing means having a thermally insulated part extending around the receiving station region and around the conductive mounting, the housing means also extending around the heat pipe means and formed with apertures to permit cooling air to flow by convention across surfaces of the heat pipe means with the housing means separating the receiving station region from the air flow.

2. An electronic unit according to claim 1 wherein the two spaced apart holding elements are each separately heat conductively connected to the heat pipe means.

3. An electronic unit according to claim 2 wherein the heat pipe means comprises two heat pipe structures each comprising at least one heat pipe heat conductively connected to an individual holding element and heat emitting fin means heat conductively carried by the at least one heat pipe.

4. An electronic unit according to claim 3 wherein the two heat pipe structures extend from opposite sides of the receiving station region with the two heat pipe structures and the receiving station region being in alignment.

5. An electronic unit according to claim 4 wherein the two holding elements are spaced apart horizontally and extend vertically and each heat pipe structure has at least one heat pipe having a first portion extending upwards in heat conductive contact with a surface of its respective vertical holding element, the first portion extending into a second portion which extends in a direction laterally of the respective vertical holding element, the second portion carrying the heat emitting fin means.

6. An electronic unit according to claim 5 wherein each heat pipe structure comprises a plurality of heat pipes each having a first portion, the first portions of the heat pipes being disposed one at a lower level than an other and with the second portions also being disposed one at a lower level than an other, and the fin means comprises a plurality of fins carried by the second portions of the heat pipes, the fins spaced apart along the heat pipes and extending laterally of the longitudinal direction of the heat pipes.

7. An electronic unit according to claim 6 wherein one at least one the fins extends across and is carried by the second portions of at least two heat pipes.

8. An electronic unit according to claim 4 wherein the two holding elements are spaced apart horizontally and extend vertically and each heat pipe structure has at least one heat pipe having a first portion extending across a surface of its respective holding element, the first portion extending into a second portion which extends in a direction away from the receiving station region, the second portion carrying the heat emitting fin means.

9. An electronic unit according to claim 4 wherein the two holding elements are spaced apart vertically and extend horizontally and each heat pipe structure has at least one heat pipe having a first portion extending across a surface of its respective holding element, the first portion extending into a second portion which extends away from the receiving station region, the second portion carrying the heat emitting fin means.

10. An electronic unit according to claim 1 wherein the two holding elements form part of a single unit also comprising a base extending between and heat conductively connected to each holding element, and the heat pipe means comprises a plurality of heat pipes each having a first portion carried by the base, the heat pipes extending from opposite ends of the base into second portions of the heat pipes, the second portions disposed beyond the receiving station region and beyond the holding elements and carrying heat emitting fin means of the heat pipe means.

11. An electronic unit according to claim 10 wherein the second portions of the heat pipes and the heat emitting fin means are in alignment with the receiving station region and at each side of the receiving station region.

12. An electronic unit according to claim 1 wherein the heat pipe means comprises at least one heat pipe which is heat conductively connected to the two holding elements, the at least one heat pipe extending outwardly away from the receiving station region and carrying heat emitting fin means spaced from the receiving station region, and the housing means comprises a thermally insulated housing part extending over the receiving station region to ensure that substantially all of the heat removed from the receiving station region is removed solely through the heat conductive mounting and the heat pipe means.

13. An electronic unit according to claim 11 wherein the housing means also includes a further housing part disposed over the fin means, the further housing part having a plurality of air flow apertures extending therethrough, each of the air flow apertures having a depth from the inside to the outside of the further housing part which exceeds the width of the aperture.

\* \* \* \* \*